(12) United States Patent
Brown et al.

(10) Patent No.: US 7,940,123 B2
(45) Date of Patent: May 10, 2011

(54) DC SERIES-FED AMPLIFIER ARRAY

(75) Inventors: Kenneth William Brown, Yucaipa, CA (US); Andrew Kent Brown, Victorville, CA (US); Darin Michael Gritters, Calimesa, CA (US)

(73) Assignee: Raytheon Company, Waltham, MA (US)

( * ) Notice: Subject to any disclaimer, the term of this patent is extended or adjusted under 35 U.S.C. 154(b) by 665 days.

(21) Appl. No.: 12/028,702

(22) Filed: Feb. 8, 2008

(65) Prior Publication Data
US 2010/0277242 A1    Nov. 4, 2010

(51) Int. Cl.
*H03F 3/04*    (2006.01)
(52) U.S. Cl. ............... 330/296; 330/295; 330/124 R
(58) Field of Classification Search .......... 330/295, 330/124 R, 84, 54, 286
See application file for complete search history.

(56) References Cited

U.S. PATENT DOCUMENTS

| | | | |
|---|---|---|---|
| 4,631,493 A | 12/1986 | Vendelin et al. | |
| 5,121,084 A * | 6/1992 | Anderson et al. | 330/295 |
| 7,298,344 B2 | 11/2007 | Brown | |

* cited by examiner

*Primary Examiner* — Hieu P Nguyen
(74) *Attorney, Agent, or Firm* — SoCal IP Law Group LLP; John E. Gunther; Steven C. Sereboff

(57) ABSTRACT

There is disclosed an amplifier module which may include a plurality of N circuit devices, each of which may have at least two stages of amplification. Each circuit device may additionally have a DC input power terminal, a DC power return terminal, and at least one bias voltage terminal. The DC power terminals of the N circuit devices may be connected in series. A bias voltage network may have at least N taps, and each of the N taps may be connected to a bias voltage terminal of a corresponding one of the N circuit devices.

14 Claims, 9 Drawing Sheets

DC SERIES-FED AMPLIFIER ARRAY

RELATED APPLICATION INFORMATION

This patent is related to copending application Ser. No. 11/841,580, titled "MODULAR MMW POWER SOURCE", filed Aug. 20, 2007.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

1. Field

This disclosure relates to sources for millimeter wave (MMW) RF power, and to high power sources for W-band applications in particular.

2. Description of the Related Art

Sources of medium and high power MMW radiation can be applied in communications systems and in directed energy weapons. While lower frequency MMW wave applications can now be satisfied with solid-state sources, high power sources for the W-band (75 GHz to 110 GHz) and above traditionally incorporate tubes such as magnetrons or gyrotrons. However, such tubes are expensive, bulky, fragile, and require high voltage electrical power. Thus MMW sources incorporating tubes are not readily portable.

Semiconductor devices are now available for use as oscillators or amplifiers in the W-band, but the available power output from each semiconductor device may be limited to no more than a few watts. Thus medium and high power solid state W-band sources may use quasi-optical methods that combine the power output from a large plurality of semiconductor devices within a waveguide or in free space. Approaches that have been suggested for combining the power output from plural semiconductor devices include the reflect array amplifier described in U.S. Pat. No. 6,765,535, the grid array amplifier described in U.S. Pat. No. 6,559,724, and the lens array or tray amplifier described in U.S. Pat. No. 5,736,908.

Throughout this description, elements appearing in figures are assigned three-digit reference designators, where the most significant digit is the figure number and the two least significant digits are specific to the element. An element that is not described in conjunction with a figure may be presumed to have the same characteristics and function as a previously-described element having a reference designator with the same least significant digits.

DETAILED DESCRIPTION

Description of Apparatus

Figure 1:
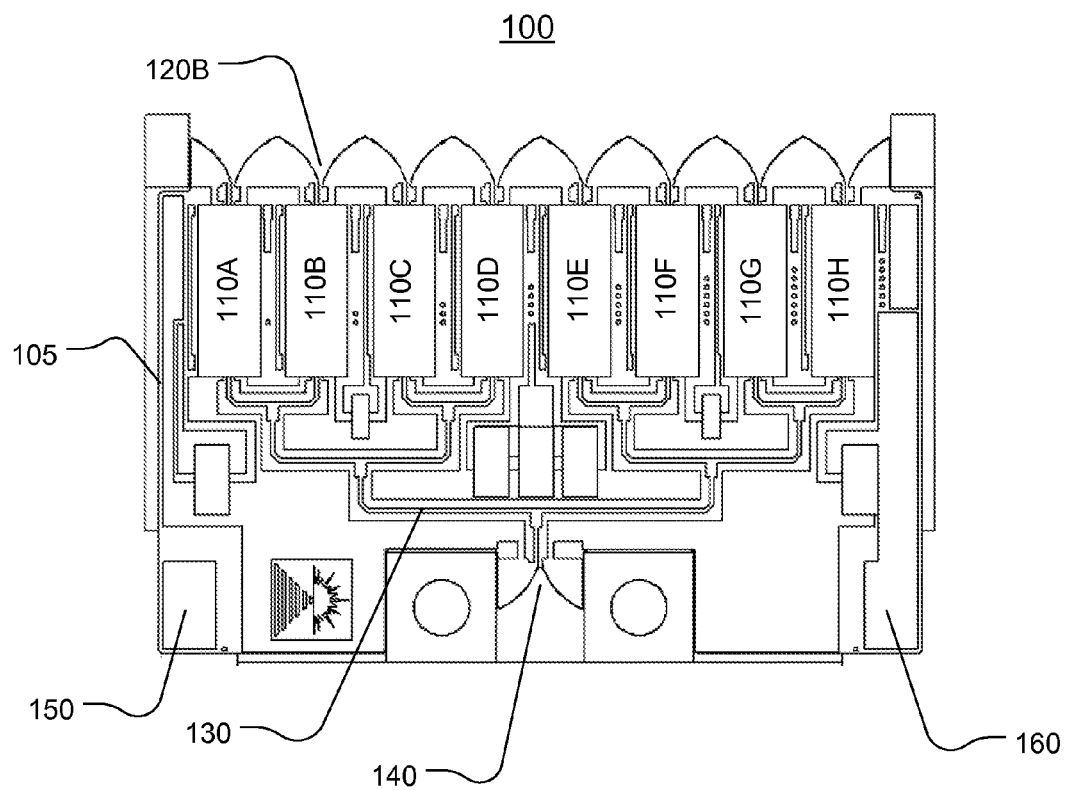
FIG. 1 is a plan view of an amplifier module.

Referring now to FIG. 1, an exemplary amplifier module 100 may include a generally rectangular dielectric substrate 105 having parallel front and back surfaces. The amplifier module 100 may be as described in copending application Ser. No. 11/841,580, titled "MODULAR MMW POWER SOURCE", filed Aug. 20, 2007. The dielectric substrate 105 may be fabricated of alumina, beryllia, aluminum nitride, or other dielectric material suitable for use at the frequency of operation of the amplifier module 100. A plurality of circuit devices 110A-110H may be disposed on the front surface of substrate 105. While the exemplary amplifier module 100 includes eight circuit devices, there may be more or fewer circuit devices. An amplifier module may include N circuit devices, where N is an integer greater than 1. A plurality of radiating elements, of which radiating element 120B is typical, may be disposed in a linear array along a first side of substrate 105 (the top side as seen in FIG. 1). The number of radiating elements may be equal to the number of circuit elements. Each radiating element may be coupled to an output of a corresponding circuit element.

At least one receiving element 140 may be disposed proximate a second side of substrate 105 opposed to the first side. The receiving element 140 may be coupled to an input of a power divider 130 may that be comprised of stripline conductors on the surface of substrate 105. The power divider 130 may have a plurality of outputs, each of which is coupled to an input of a corresponding circuit element 110A-110H. A plurality of receiving elements similar to receiving element 140 may be disposed along the second side of the substrate 105. There may be one receiving element corresponding to each circuit device 100A-110H.

Each circuit device 110A-110H may include an amplifier circuit that accepts an input signal from the power divider 130 and provides an amplified output signal to the corresponding radiating element. Each amplifier circuit may include two or more stages of amplification. Each circuit device 110A-110H may additionally include a phase shifter and/or an amplitude adjuster circuit and/or other transmit/receive functionality.

Each circuit device 110A-110H may require a source of DC power. Each circuit device may include a DC power input terminal and a DC power return terminal. In this context, the term "terminal" means a connection, but not necessarily an external point or terminal on the package of each circuit device. Particularly in the situation where multiple circuit devices may be fabricated within a common package or on a common integrated circuit substrate, the DC power input terminal and/or the DC power return terminal for a given circuit device may be internal to the package. The DC power required by the circuit devices 110A-110H may be introduced to the exemplary amplifier module 100 at a module DC power input terminal 150 and a module DC power return terminal 160. Although terminals 150 and 160 are shown as pads in FIG. 1, pins, sockets, wires, or other electrical connection means may be used to connect the amplifier module 100 to the DC power supply.

Figure 2:
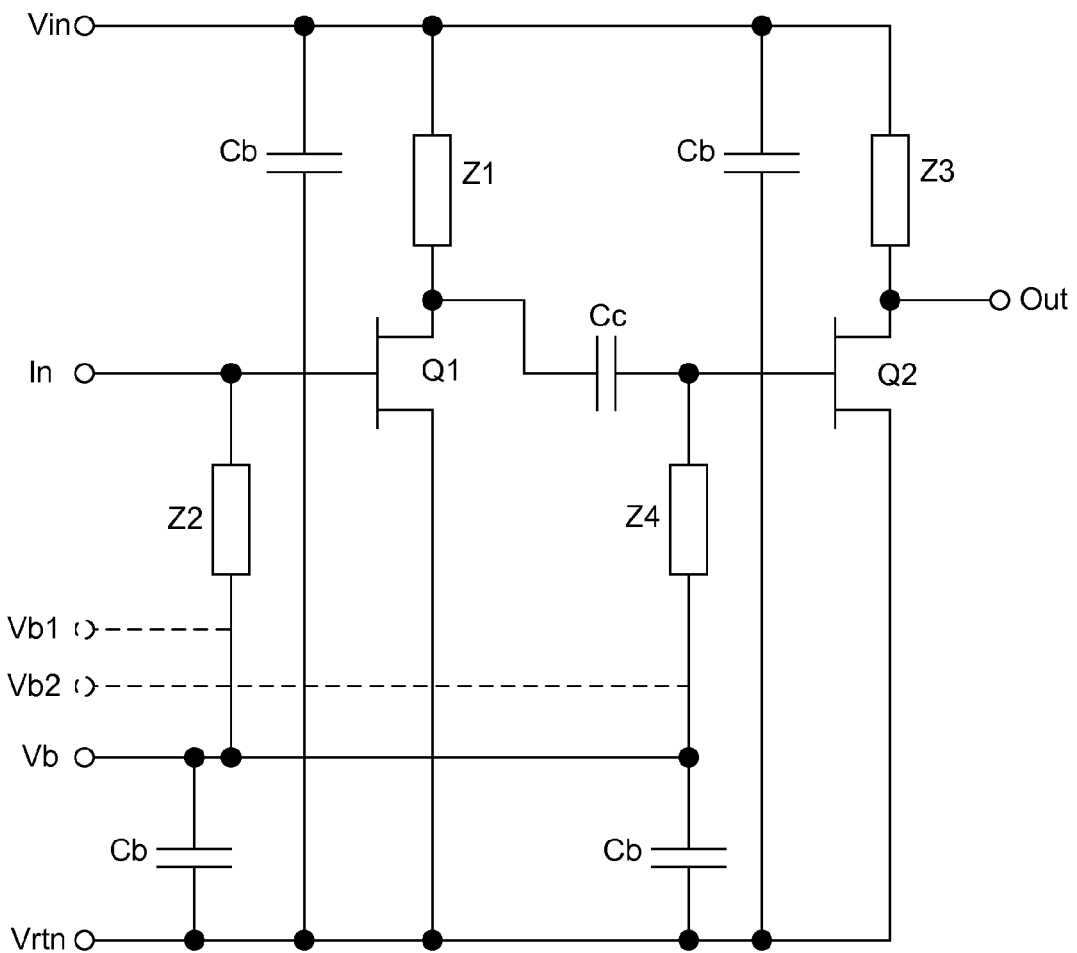
FIG. 2 is a simplified schematic diagram of an exemplary amplifier device.

FIG. 2 shows a simplified schematic diagram of an exemplary amplifier 200, which may be suitable for use within the circuit devices 110A-110H. It should be recognized that the lumped passive components shown in FIG. 2 may be implemented as transmission line structures. The components Z1-Z4 may each have a complex impedance required to establish the desired DC operating conditions and RF gain. Additional components, not shown in FIG. 2 may be required to match the desired input and output impedance, and to provide impedance matching between the stages of the amplifier.

The exemplary amplifier 200 may have at least two stages of amplification, which may be provided by transistors Q1 and Q2. Transistors Q1 and Q2 may be P-channel or N-channel field effect transistors, including junction field effect transistors, metal-oxide-semiconductor field effect transistors, insulated-gate field effect transistors, or high electron mobility transistors. Transistors Q1 and Q2 may be NPN or PNP bipolar transistors, or some other form of transistor suitable for amplifying signals at the frequency of interest. Transistors Q1 and Q2 may be any field effect transistor or bipolar transistor.

The exemplary amplifier 200 may have a power input terminal Vin and a power return terminal Vrtn to receive the DC power necessary to operate the amplifier. Depending on the type of transistors used in the amplifier, the voltage provided to the power input terminal Vin may be positive or negative with respect to the power return terminal Vrtn.

The exemplary amplifier 200 may also have at least one bias voltage terminal Vb to receive a voltage used to establish the required DC bias conditions for the amplifier stages. The bias voltage Vb may be common to all stages of the two or more stages of amplification. Depending on the type of transistors used in the amplifier, the bias voltage provided to the bias voltage terminal Vb may be positive or negative with respect to the power return terminal Vrtn. The bias voltage provided to the bias voltage terminal Vb may have the same or opposite polarity (with respect to Vrtn) as the voltage provided to the power input terminal Vin. The exemplary amplifier 200 may have at plurality of bias voltage terminals Vb1, Vb2, etc., (as shown in dashed lines) to receive a corresponding plurality of voltages used to establish the required DC bias conditions for the amplifier stages. Each bias voltage Vb1, Vb2, etc., may connected to one or more stages of amplification.

Microwave amplifiers, such as exemplary amplifier 200, may have a power added efficiency of about 30%. Thus an amplifier device providing 1.5 watts of microwave output power may require 5 watts of DC input power. Microwave amplifiers may be inherently low-voltage devices, such that an amplifier providing 1.5 watts of microwave output power may require, for example, a DC power source providing 2 amps at 2.5 volts.

Figure 3:
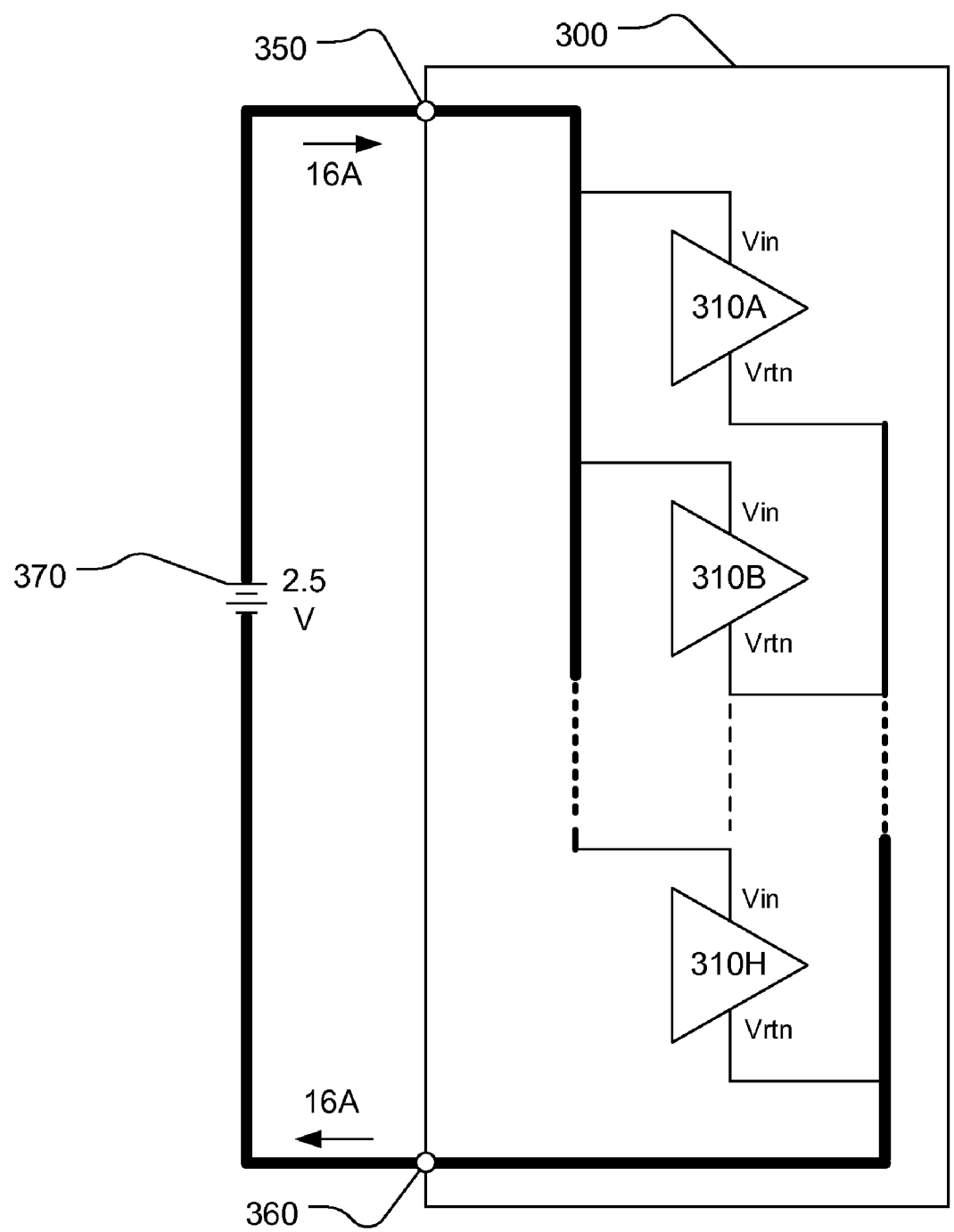
FIG. 3 is a block diagram of an amplifier array having the amplifier power terminals connected in parallel.

Referring now to FIG. 3, an amplifier module 300, which may be the amplifier module 100, may have the DC power provided to a plurality (eight in this example) of amplifier devices in parallel. In this example, the amplifier module may require 16 amps of DC input power at 2.5 volts, for a total of 40 watts of DC power. The electrical connections from the power source 370 to the module power input terminal 350 and from the module power return terminal 360 back to the power source 370 may carry the full 16 amp current. Additionally, each amplifier device 310A-H may be connected to the DC power input terminal 350 and to the DC power return terminal 360 within the amplifier module 300. At least some portion of the electrical conductors within the amplifier module 300 may have to carry the full 16 amp current, as indicated by the bold lines in FIG. 3.

Figure 4:
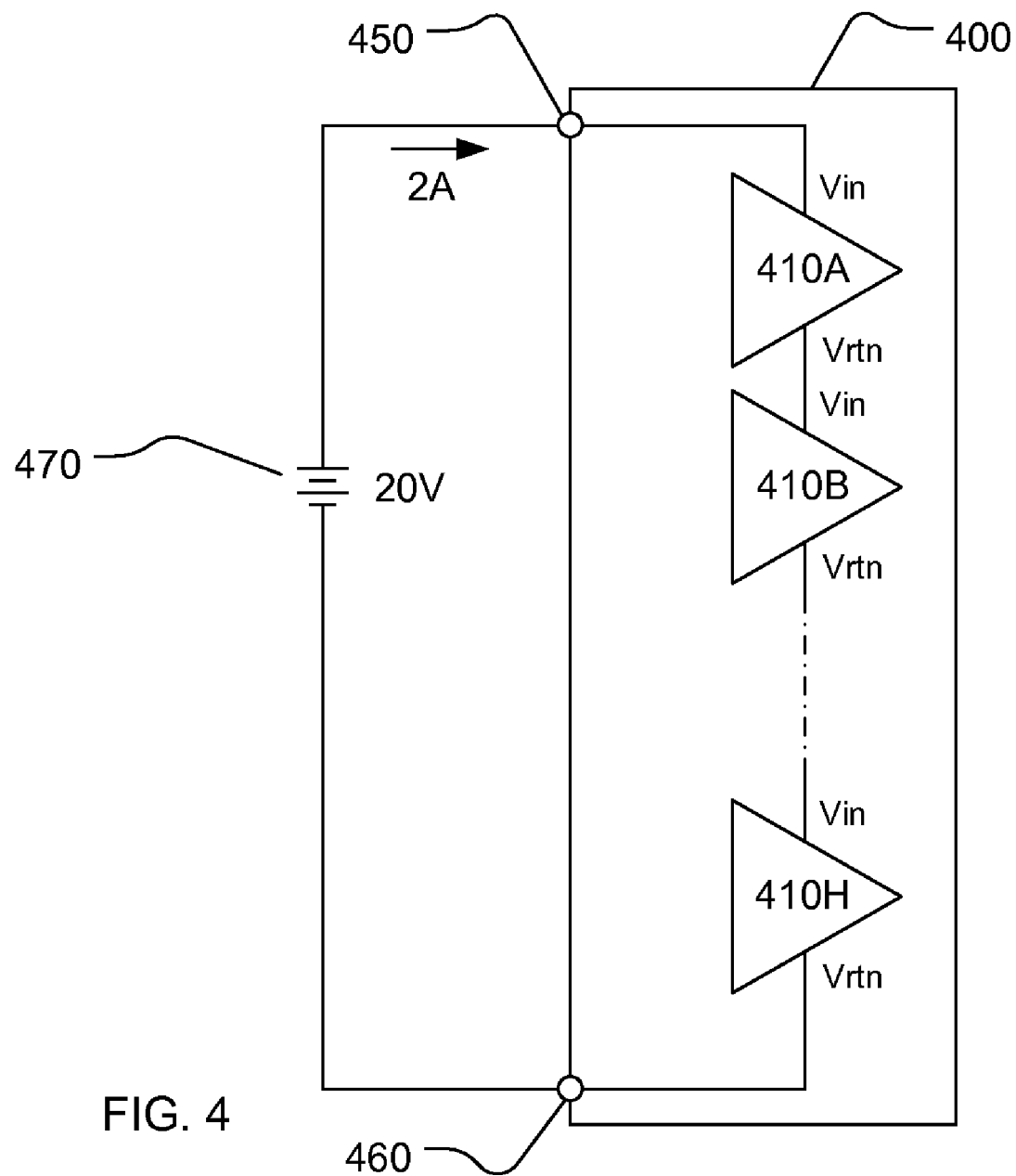
FIG. 4 is a block diagram of an amplifier array having the amplifier power terminals connected in series.

Referring now to FIG. 4, an amplifier module 400, which may be the amplifier module 100, may have a plurality (eight in this example) of N amplifier devices 410A-H that may receive DC power in series. To "receive DC power in series" specifically means that the DC power input terminals Vin and the DC power return terminals Vrtn of the N amplifier circuit devices 410A-H are connected in series. Connecting the DC power input terminals and DC power return terminals in series specifically means that the DC power input terminal Vin of each device is connected to the DC power return terminal Vrtn of an adjacent device, with the exceptions that the DC power input terminal Vin of the amplifier circuit device 410A at one end of the N series-connected devices is coupled to the module DC power input terminal 450 and the DC power return terminal Vrtn of the amplifier circuit device 410H at the other end of the N series-connected devices is coupled to the module DC power return terminal 460. In this example, the amplifier module may require 2 amps of DC input power at 20 volts, for a total of 40 watts of DC power. The electrical connections from the power source 470 to the module DC power input terminal 450 and from the module DC power return terminal 460 back to the power source 470 may need to carry only the required 2 amp current. Additionally, the module DC power input terminal 450 may only be connected to the first amplifier device 410A and the module DC power return terminal 460 may only be connected to the last amplifier device 410H.

Figure 5:
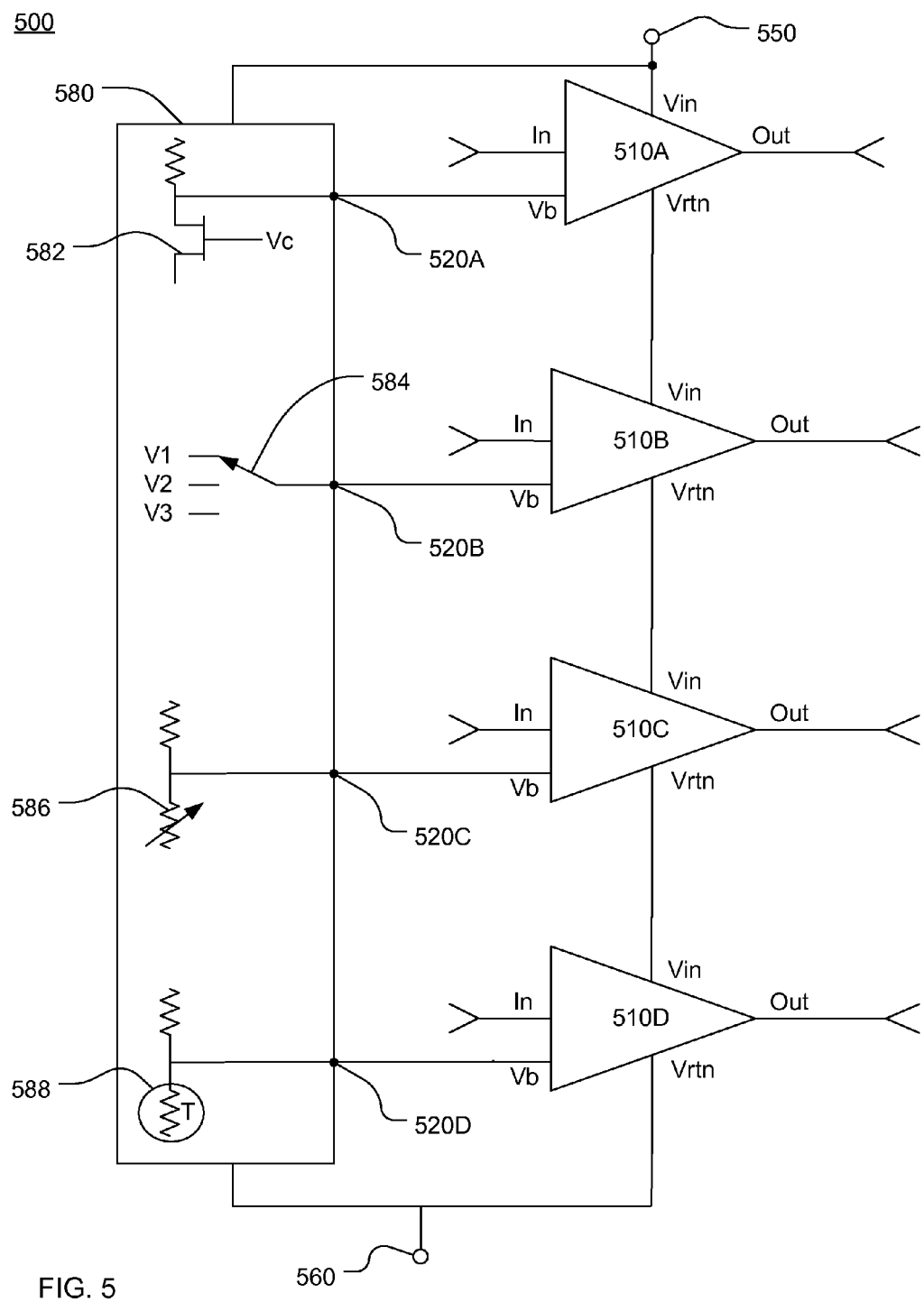
FIG. 5 is a schematic diagram of an amplifier module including a bias voltage distribution network.

FIG. 5 is a simplified schematic diagram of an exemplary amplifier module 500. Four amplifier circuit devices 510A-D receive DC power in series. While four amplifier devices are shown in this example, amplifier module 500 may include eight amplifier devices or some other number of amplifier devices. A bias voltage network 580 is connected from the module DC power input terminal 550 to the module DC power return terminal 560. The bias voltage network 580 may have one tap for each amplifier device in amplifier module 500, as shown in FIG. 5. In this context, the word "tap" is intended to have a similar meaning to a tap on a transformer. A "tap" is a circuit node having a voltage equal to a predetermined portion of the total voltage applied across the bias voltage network 580. In this example, the bias voltage network has four taps, 520A-D. Each tap 520A-D provides a bias voltage to the corresponding amplifier circuit 510A-D.

Although not shown in FIG. 5, the bias voltage network 580 may have more than one tap and may provide more than one bias voltage for each amplifier circuit 510A-D in amplifier module 500.

The bias voltage network 580 may have a plurality of internal taps for each amplifier circuit 510A-D and may include switching circuits, such as switch 584, to switch the bias voltages provided to the amplifier circuit devices. While only one switching circuit 584 is shown in FIG. 5, a similar switching circuit may be provided to correspond with each of the amplifier circuit devices 510A-D. The switching circuits may be or include a mechanical switch, such as a relay, or may be a solid state switch. The bias voltage network 580 may include one or more active semiconductor components, such as transistor 582, and the bias voltage network 580 may accept one or more input signals or voltages, such as voltage Vc, to control or change the bias voltages provided to the amplifier circuits 510A-D. Switchable or variable bias voltages may be used, for example, to change the gain or operating class of the amplifier circuits 510A-D.

The bias voltage network 580 may include passive components such as resistors, capacitors, and diodes, and active components such as transistors. The bias voltage network 580 may include one or more temperature-sensitive components, such as thermistor 588, such that the bias voltages provided at the taps 520A-D may vary with the temperature of the amplifier module 500.

Figure 6:
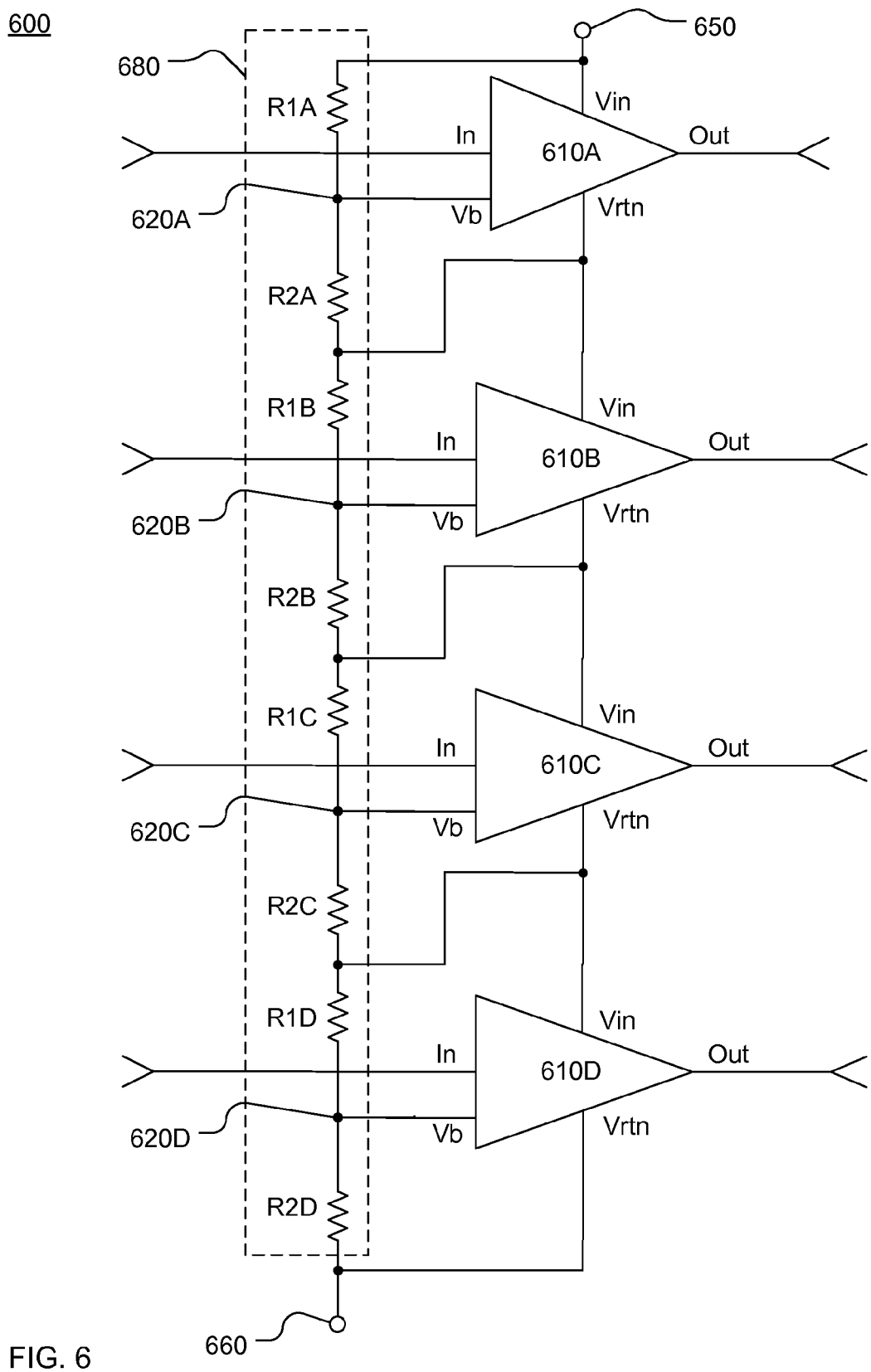
FIG. 6 is a schematic diagram of an amplifier module including a bias voltage distribution network.

FIG. 6 is a simplified schematic diagram of an exemplary amplifier module 600. The examples of FIGS. 6-9 each show four amplifier circuit devices, but may be extended to any number of amplifier circuits. In FIG. 6, the four amplifier circuit devices 610A-D receive DC power in series. A bias voltage network 680, consisting of series-connected resistors R1A-R2D, may be connected from the module DC power input terminal 650 to the module DC power return terminal 660. The bias voltage network 680 may include a pair of resistors R1A/R2A-R1D/R2D for each of the four amplifier circuit devices 610A-D. Each pair of resistors R1A/R2A-R1D/R2D may be connected in series from the Vin terminal to the Vrtn terminal of the corresponding amplifier circuit device 610A-D. The junction of each pair of resistors R1A/R2A-R1D/R2D may serve as a tap 620A-D to provide a bias voltage Vb to the corresponding amplifier circuit device 610A-D. While the exemplary amplifier module 600 is shown having four amplifier devices 610A-D and four pairs of resistors R1A/R2A-R1D/R2D, an amplifier module may have more or fewer amplifier circuit devices and resistor pairs.

The bias voltage network 680 may provide each amplifier circuit device 610A-D with a bias voltage that is between the voltages Vin and Vrtn provided to the amplifier circuit device. Thus the bias voltage network 680 may be suitable for use with amplifier circuit devices incorporating bipolar transistors and some types of FET transistors.

Figure 7:
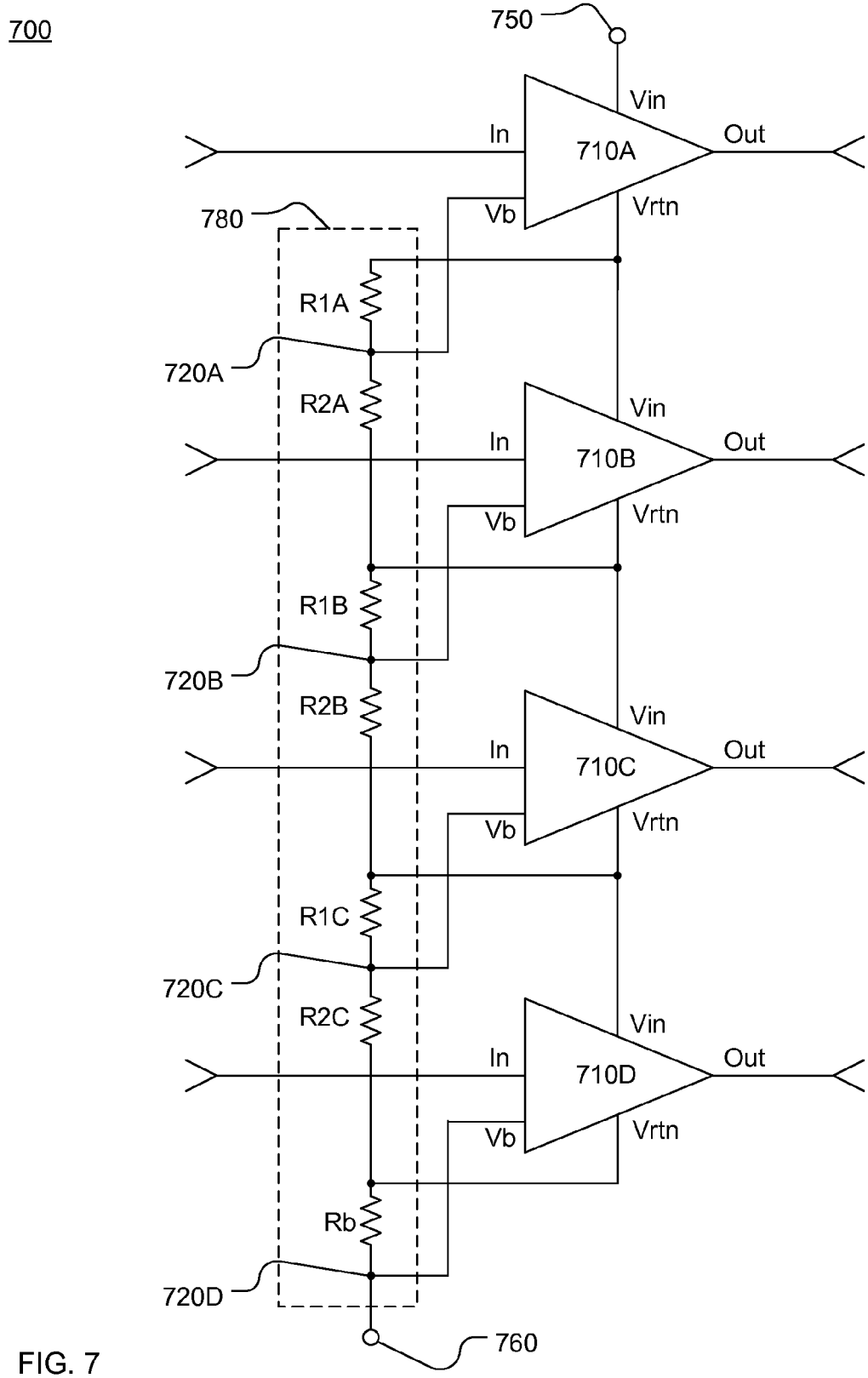
FIG. 7 is a schematic diagram of an amplifier module including a bias voltage distribution network.

FIG. 7 is a simplified schematic diagram of another exemplary amplifier module 700. Four amplifier circuit devices 710A-D receive DC power in series. A bias voltage network 780, consisting of series-connected resistors R1A-R2C and Rb, may be connected from the module DC power input terminal 750 to the module DC power return terminal 760. The Vrtn terminal of amplifier circuit device 710D may be connected to the module DC power return terminal 760 through a bias resistor Rb. The bias voltage terminal Vb of amplifier circuit device 710D may be connected to the module DC power return terminal 760. The DC current flow through bias resistor Rb may cause a voltage drop such that the voltage at the Vb terminal of amplifier circuit device 710D may have the opposite polarity from the voltage at the Vin terminal of amplifier circuit device 710D (both with respect to the Vrtn terminal of the amplifier circuit device 710D).

The bias voltage network 780 may include a pair of resistors R1A/R1B-R1C/R2C for each of the three other amplifier circuit devices 710A-C. Each pair of resistors R1A/R1B-R1C/R2C may be connected in series from the Vrtn terminal of the corresponding amplifier circuit device 710A-C to the Vrtn terminal of the adjacent device 710B-D. The junction of each pair of resistors R1A/R1B-R1C/R2C may serve as a tap 620A-C to provide a bias voltage Vb to the corresponding amplifier circuit device 710A-C. While the exemplary amplifier module 700 is shown having four amplifier devices 710A-D and three pairs of resistors R1A/R1B-R1C/R2C, an amplifier module may have more or fewer amplifier devices and resistor pairs.

The bias voltage network 780 may provide each amplifier device 710A-D with a bias voltage that has the opposite polarity (with respect to Vrtn) from the DC power voltage Vin provided to the amplifier device. Thus the bias voltage network 780 may be suitable for use with amplifier devices incorporating certain types of FET transistors that operate with the voltage applied to the gate electrode having the opposite polarity (with respect to the source electrode) from the voltage applied to the drain electrode.

Figure 8:
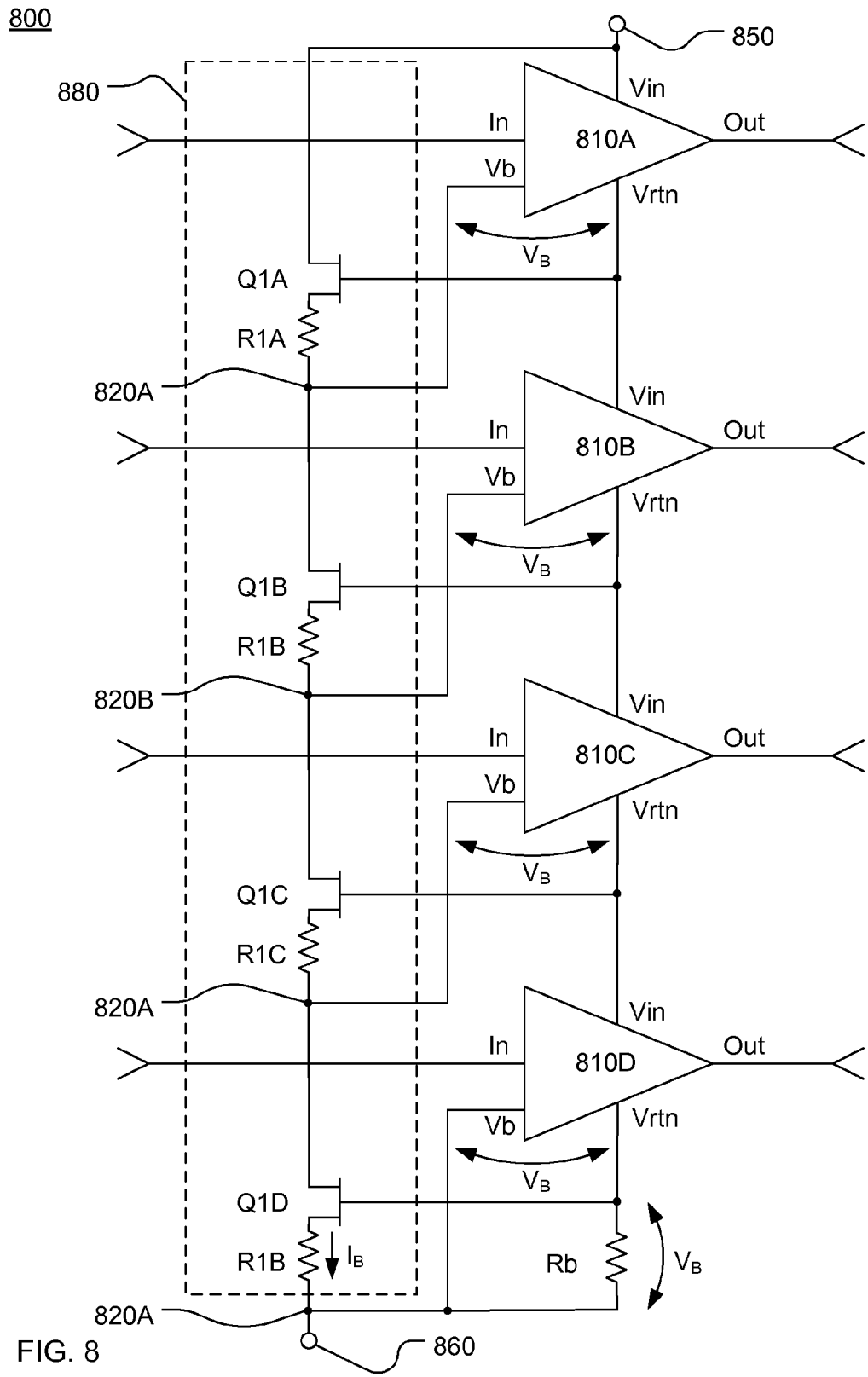
FIG. 8 is a schematic diagram of an amplifier module including a bias voltage distribution network.

FIG. 8 is a simplified schematic diagram of another exemplary amplifier module 800. Four amplifier circuit devices 810A-D receive DC power in series. A bias voltage network 880, consisting of series-connected resistor-transistor pairs R1A/Q1A-R1D/Q1D, may be connected from the module DC power input terminal 850 to the module DC power return terminal 860. Each resistor-transistor pair may correspond to one of the amplifier circuit devices 810A-D. Within each resistor-transistor pair, the source of the transistor may be connected to one end of the resistor. The gate of each transistor may be connected to the Vrtn terminal of the corresponding amplifier circuit device 810A-D. The second end of each resistor may be connected to the Vb terminal of the corresponding amplifier circuit device 810A-D.

The resistor-transistor pairs are connected in series such that a common current $I_B$ flows through each resistor and between the source and drain electrodes of each transistor. The Vrtn terminal of amplifier circuit device 810D may be connected to the module DC power return terminal 760 through a bias resistor Rb. The DC current flow through the series-connected amplifier circuit devices 810A-D causes a voltage Vb across the bias resistor Rb. The voltage $V_B$ may be applied to the gate of transistor Q1D, such that the current flow $I_B$ through resistor R1D may be equal to (Vb−Vth)/R1D, where Vth is the threshold voltage of transistor Q1D.

The current $I_B$ may flow through the series-connected resistor-transistor pairs R1A/Q1A-R1D/Q1D. Since the same current $I_B$ flows through the series-connected components of the bias voltage network 880, the voltage between the gate of each transistor and the lower end of the corresponding resistor, which is the same as the voltage between the Vb terminal and the Vrtn terminal of the corresponding amplifier circuit device 810A-D, will be $V_B$.

Thus the bias voltage network 880 may provide each amplifier device 810A-D with a bias voltage $V_B$ that has the opposite polarity (with respect to Vrtn) from the DC power voltage Vin provided to each amplifier circuit device 810A-D. The bias voltage $V_B$ applied to each of the amplifier circuit devices 810A-D can be varied simultaneously by changing, for example, the value of the resistor Rb.

The bias voltage network 880, as shown in FIG. 8, may be suitable for use with amplifier circuit devices incorporating certain types of FET transistors that operate with the voltage applied to the gate electrode having the opposite polarity (with respect to the source electrode) from the voltage applied to the drain electrode. It will be evident to one of skill in the art that the bias voltage network 880 can be easily reconfigured (by reversing the direction of the current $I_B$) to provide each amplifier circuit device 810A-D with a bias voltage having the same polarity (with respect to Vrtn) as the DC power voltage Vin provided to each amplifier circuit device.

It will also be evident to one of skill of the art that an essentially equivalent bias voltage network may be provided using bipolar transistors, where the emitter of each transistor may be connected to the corresponding resistor and the base of each transistor may be connected to the Vrtn terminal of the corresponding amplifier circuit device 810A-D.

Figure 9:
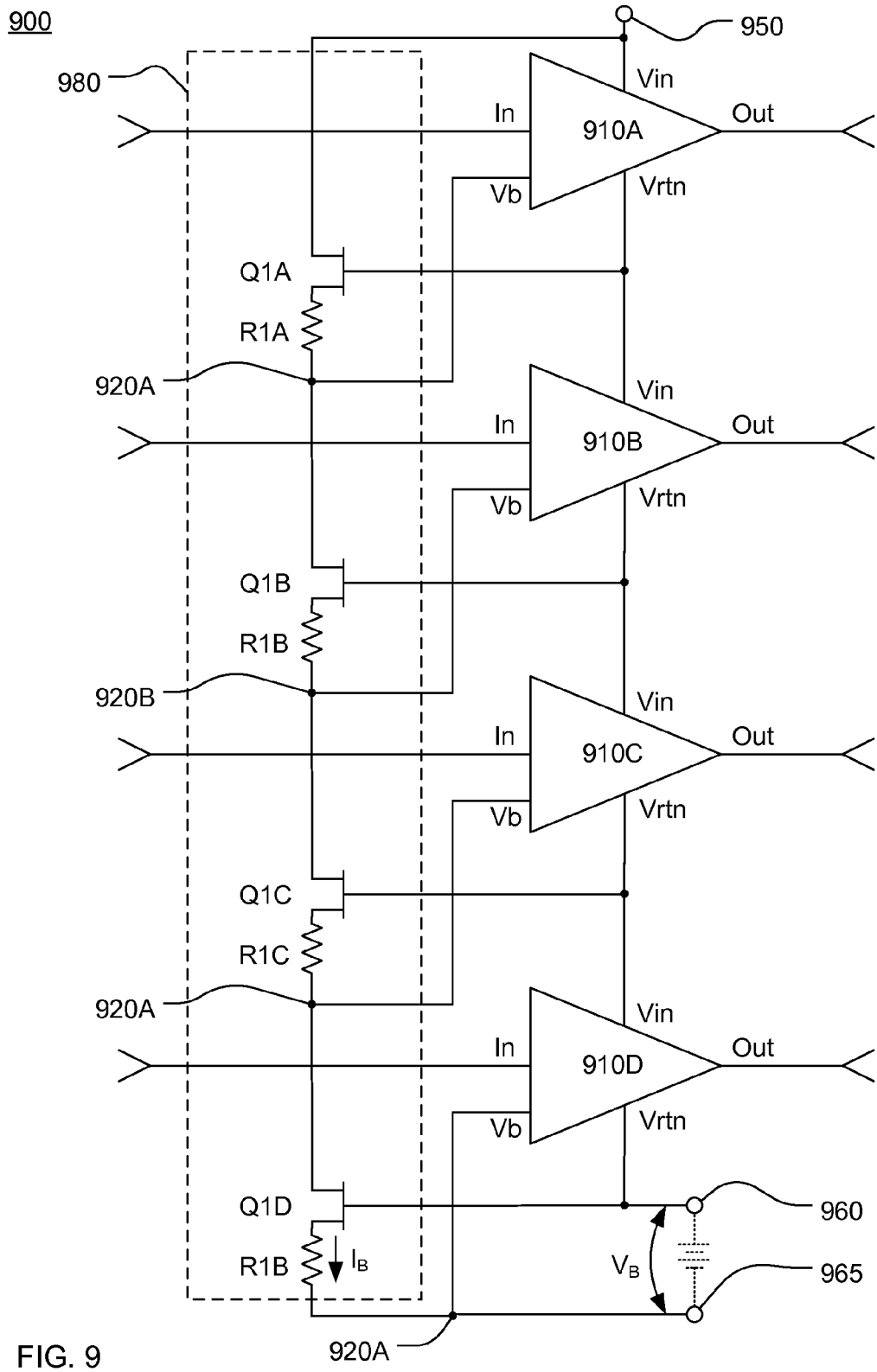
FIG. 9 is a schematic diagram of an amplifier module including a bias voltage distribution network.

FIG. 9 is a simplified schematic diagram of another exemplary amplifier module 900. The amplifier module 900 may be the same as the previously described amplifier module 800 except that the bias voltage $V_B$ may be provided from an external voltage source (shown in dashed lines) through a module bias voltage input terminal 965. The bias voltage network 980 effectively replicates the voltage $V_B$ between the Vb and Vrtn terminals of each amplifier circuit device 910A-D, such that a changing the voltage applied to the module bias voltage input terminal 965 causes a corresponding change in the bias voltage applied to each amplifier circuit device 910A-D. Thus a single input voltage may be used to control the gain, operating class, or other parameter of the amplifier circuit devices 910A-D in unison.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

For means-plus-function limitations recited in the claims, the means are not intended to be limited to the means disclosed herein for performing the recited function, but are intended to cover in scope any means, known now or later developed, for performing the recited function.

As used herein, "plurality" means two or more.

As used herein, a "set" of items may include one or more of such items.

As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of" respectively, are closed or semi-closed transitional phrases with respect to claims.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

As used herein, "and/or" means that the listed items are alternatives, but the alternatives also include any combination of the listed items.

It is claimed:

1. An amplifier module comprising
   N circuit devices, where N is an integer greater than 1
      each circuit device comprising at least two stages of amplification
      each circuit device having a DC power input terminal, a DC power return terminal, and at least one bias voltage terminal
      wherein the DC power input terminals and the DC power return terminals of the N circuit devices are connected in series, the DC power input terminal of the circuit device at one end of the N series-connected circuit devices is connected to a module power input terminal, and the DC power return terminal of the circuit device at the other end of the N series-connected circuit devices is connected to a module power return terminal through a bias resistor
   a bias voltage network having at least N taps, each of the N taps connected to a bias voltage terminal of a corresponding one of the N circuit devices.

2. The amplifier module of claim 1, wherein
   each circuit device has a single bias voltage terminal common to all stages of amplification
   the bias voltage network has N taps, each tap connected to the bias voltage terminal of the corresponding circuit device.

3. The amplifier module of claim 1, the bias voltage network comprising
   N−1 pairs of resistors
      each of the N−1 pairs of resistors connected in series between the DC power return terminal of a corresponding one of the N circuit devices and the DC power return terminal of an adjacent one of the N circuit devices
      the junction of each of the N−1 pairs of resistors connected to the bias voltage terminal of the corresponding one of the N circuit devices.

4. The amplifier module of claim 1, each of the N circuit devices further comprising at least one of a phase shifter and a gain adjuster.

5. An amplifier module, comprising
   N circuit devices, where N is an integer greater than 1
      each circuit device comprising at least two stages of amplification
      each circuit device having a DC power input terminal, a DC power return terminal, and k bias voltage terminals, wherein k is an integer greater than one
      wherein the DC power input terminals and the DC power return terminals of the N circuit devices are connected in series
   a bias voltage network having kN taps, each tap connected to one of the k bias voltage terminals of the corresponding circuit device.

6. The amplifier module of claim 5, wherein
   the DC power input terminal of the circuit device at one end of the N series-connected circuit devices is connected to a module power input terminal
   the DC power return terminal of the circuit device at the other end of the N series-connected circuit devices is connected to a module power return terminal.

7. The amplifier module of claim 5, wherein
   the DC power input terminal of the circuit device at one end of the N series-connected circuit devices is connected to a module power input terminal
   the DC power return terminal of the circuit device at the other end of the N series-connected circuit devices is connected to a module power return terminal through a bias resistor.

8. The amplifier module of claim 5, each of the N circuit devices further comprising at least one of a phase shifter and a gain adjuster.

9. An amplifier module, comprising
   N circuit devices, where N is an integer greater than 1
      each circuit device comprising at least two stages of amplification
      each circuit device having a DC power input terminal, a DC power return terminal, and at least one bias voltage terminal
      wherein the DC power input terminals and the DC power return terminals of the N circuit devices are connected in series
   a bias voltage network comprising N switching circuits corresponding to the N circuit devices, each switching circuit to select at least one bias voltage for the corresponding circuit device from a plurality of voltages generated within the bias voltage network.

10. The amplifier module of claim 9, each of the N circuit devices further comprising at least one of a phase shifter and a gain adjuster.

11. An amplifier module comprising
N circuit devices, where N is an integer greater than 1
  each circuit device comprising at least two stages of amplification
  each circuit device having a DC power input terminal, a DC power return terminal, and a bias voltage terminal common to all stages of amplification
  wherein the DC power input terminals and the DC power return terminals of the N circuit devices are connected in series
a bias voltage network comprising N pairs of a transistor and a resistor, each pair to provide a bias voltage to a corresponding circuit device, wherein
  each transistor is selected from the group consisting of a field effect transistor having gate, source, and drain electrodes and a bipolar transistor having base, emitter, and collector electrodes
  the source or emitter of each transistor connected to a first end of the corresponding resistor
  the gate or base of each transistor connected to the DC power return terminal of the corresponding circuit device
  the second end of each resistor connected to the bias voltage terminal of the corresponding circuit device
  the N transistor-resistor pairs are connected in series, and
  the bias voltage supplied to each circuit device can be adjusted by controlling the value of a bias current that flows through the series-connected resistor-transistor pairs.

12. The amplifier module of claim 11, wherein the bias current can be controlled by varying the value of a single component.

13. The amplifier module of claim 11, wherein the bias current can be controlled by varying a bias input voltage.

14. The amplifier module of claim 11, each of the N circuit devices further comprising at least one of a phase shifter and a gain adjuster.

* * * * *